(12) United States Patent
Wyatt

(10) Patent No.: US 7,939,857 B1
(45) Date of Patent: May 10, 2011

(54) COMPOSITE DEVICE HAVING THREE OUTPUT TERMINALS

(75) Inventor: Michael A Wyatt, Clearwater, FL (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 17 days.

(21) Appl. No.: 12/546,112

(22) Filed: Aug. 24, 2009

(51) Int. Cl.
*H01L 27/118* (2006.01)

(52) U.S. Cl. ............... 257/205; 330/311; 257/E29.255; 257/E27.109

(58) Field of Classification Search .................. 330/300, 330/277, 311; 257/205, 402
See application file for complete search history.

(56) References Cited

U.S. PATENT DOCUMENTS

| 5,422,563 | A  | * | 6/1995 | Pflueger | 323/312 |
| 7,501,670 | B2 | * | 3/2009 | Murphy | 257/194 |
| 7,719,055 | B1 | * | 5/2010 | McNutt et al. | 257/341 |
| 7,777,553 | B2 | * | 8/2010 | Friedrichs | 327/436 |

* cited by examiner

*Primary Examiner* — Hieu P Nguyen
(74) *Attorney, Agent, or Firm* — RatnerPrestia

(57) ABSTRACT

A composite device includes a depletion mode FET coupled to a bipolar transistor. The FET includes gate, drain and source terminals, and the bipolar transistor includes base, collector and emitter terminals. The collector terminal of the bipolar transistor and the source terminal of the depletion mode FET are directly connected to each other. Additionally, the emitter terminal of the bipolar transistor and the gate terminal of the depletion mode FET are directly connected to each other. The voltage between the collector and emitter terminals, $V_{CE}$, is configured to bias the depletion mode FET. The $V_{CE}$ voltage has a value that is equal and opposite to a voltage $V_{GS}$ between the gate and source terminals of the depletion mode FET.

13 Claims, 3 Drawing Sheets

COMPOSITE DEVICE HAVING THREE OUTPUT TERMINALS

FIELD OF THE INVENTION

The present invention relates, in general, to a cascode device including one or more transistors requiring low voltage operations but capable of supporting higher voltages needed by radio frequency (RF) power amplifiers. More specifically, the present invention relates to a composite device including a depletion mode field effect transistor (FET) which is biased by at least one bipolar transistor, or n-channel metal-oxide-semiconductor (NMOS) transistor.

BACKGROUND OF THE INVENTION

A power amplifier providing greater than 10 Watts of power requires a relatively high primary voltage to enable an efficient radio frequency (RF) generation. On the other hand, transistors included in a circuit, which provide a digital waveform for modulating an RF signal for transmission, require low operating voltages, such as 1 to 2 volts. These transistors are typically susceptible to a low voltage breakdown and, generally, need protection from high voltages that may be reflected from the output side of a power amplifier. Impedance mismatches between the output side of a power amplifier and its load (such as an antenna) may produce a high voltage standing wave ratio (VSWR) that forms a voltage likely to exceed the safe operating margins of the transistors generating the digital waveform.

Due to operating voltage differences, separate circuits are typically required between a circuit used for generation of signal waveforms and a circuit used for generation of RF power. Hence, the need for separate digital waveform modulators and RF power amplifiers.

Conventional circuits using complimentary metal-oxide-semiconductor (CMOS) fabrication techniques cannot synthesize a waveform directly at an antenna for transmission at high RF power levels. The present invention includes a composite device that may be used for RF power generation and low voltage CMOS interfacing.

SUMMARY OF THE INVENTION

To meet this and other needs, and in view of its purposes, the present invention provides a composite device. The device includes a depletion mode FET including gate, drain and source terminals. Also included is a bipolar transistor including base, collector and emitter terminals. The collector and source terminals are directly connected to each other. A voltage, $V_{CE}$, between the collector and emitter terminals is configured to bias the depletion mode FET. The emitter and gate terminals are directly connected to each other. The voltage $V_{CE}$ is configured to have a value that is equal and opposite to a voltage, $V_{GS}$, between the gate and source terminals of the depletion mode FET. The depletion mode FET may also include a gallium nitride device. The bipolar transistor includes a large beta value, and a current value flowing through the drain terminal is approximately equal to a current value flowing through the source terminal, providing a common gate current gain of approximately one. The voltage $V_{CE}$ is configured to have a value between 1 and 2 volts, and the drain terminal is configured to support a voltage ranging from 10-100 volts. The bipolar transistor may be replaced by an NMOS transistor. The source terminal of the depletion mode FET is connected to a drain terminal of the NMOS transistor.

Another embodiment of the present invention includes a composite device having a depletion mode FET including gate, drain and source terminals, and an array of n bipolar transistors. The array includes (n−1) bipolar transistors connected in parallel having respective first collector terminals tied together, and respective first emitter terminals tied together, and one sense bipolar transistor connected in parallel with the (n−1) bipolar transistors having a second collector terminal tied to the respective first collector terminals, and a second emitter terminal electrically isolated from the first emitter terminals. A voltage, $V_{CE}$, between the first and second collector terminals and the first and second emitter terminals is configured to bias the depletion mode FET. A current, $I_{SENSE}$ used interchangeably with $I_{SE}$, flowing through the second emitter terminal provides a value that is approximately equal to a current, $I_D$, flowing through the drain terminal divided by $(C*n)$, where C is a constant value and n is the size of the array.

The base terminals of the array of n bipolar transistors are connected together. The array of n bipolar transistors includes n physically identical transistors. Each of the n bipolar transistors is matched in size to another of the n bipolar transistors by a predetermined proportionality factor. The current, $I_D$, flowing through the drain terminal is substantially equal to a sum of currents flowing through each of the first and second emitter terminals. n may be an integer value between 5 and 20. The array of n bipolar transistors may be replaced by an array of n NMOS transistors. The gate terminal and the first emitter terminals are connected to ground to provide a high reverse isolation between the drain terminal and the array of n bipolar transistors.

Yet another embodiment of the present invention is a cascode device including (a) a gallium nitride transistor (GaN transistor); (b) a silicon germanium bipolar transistor (SiGe transistor) having collector and emitter terminals, respectively, connected to source and gate terminals of the GaN transistor; (c) a drain terminal of the GaN transistor for coupling to a load, in which the load is configured for connection to a relatively high voltage supply; and (d) a base terminal of the SiGe bipolar transistor for coupling to data, in which the data is configured to vary between voltages less than 2 volts. The GaN transistor is a depletion mode field-effect-transistor, and the gate terminal of the GaN transistor is connected to a ground reference. The SiGe transistor may be replaced by an n-channel metal-oxide-semiconductor (NMOS) field-effect-transistor (FET); and the collector and emitter terminals of the SiGe transistor, respectively, may be replaced by drain and source terminals of the NMOS FET. The SiGe transistor is a first transistor, and the device further includes a plurality of SiGe transistors connected in parallel with the first SiGe bipolar transistor. Each emitter terminal of the plurality of SiGe bipolar transistors is connected to the emitter terminal of the first SiGe bipolar transistor, and each base terminal of the plurality of SiGe bipolar transistors is connected to the base terminal of the first SiGe bipolar transistor. A second SiGe bipolar transistor is connected in parallel with the first SiGe bipolar transistor. A base terminal of the second SiGe bipolar transistor connected to the base terminal of the first SiGe bipolar transistor, and an emitter terminal of the second SiGe bipolar transistor connected to an output terminal for sensing current flowing in the GaN transistor.

It is understood that the foregoing general description and the following detailed description are exemplary, but not restrictive, of the invention.

BRIEF DESCRIPTION OF THE DRAWINGS

The foregoing summary, as well as the following detailed description of exemplary embodiments of the invention, may be better understood when read in conjunction with the appended drawings, which are incorporated herein and constitute part of this specification. For the purposes of illustrating the invention, there are shown in the drawings exemplary embodiments of the present invention. It should be understood, however, that the invention is not limited to the precise arrangements and instrumentalities shown. In the drawings, the same reference numerals are employed for designating the same elements throughout the several figures. In the drawings.

DETAILED DESCRIPTION OF THE INVENTION

The present invention includes a composite device having a depletion mode field-effect-transistor (FET transistor) which includes three terminals. The depletion mode FET is coupled to a bipolar transistor which also includes three terminals. As will be explained, the composite device, referred to by the inventor as a "GaNsistor", combines both the FET and the bipolar transistors to provide three output terminals, namely, a base, a drain and an emitter/gate.

The depletion mode FET transistor may be a gallium nitride high electron mobility transistor (GaN transistor) and the bipolar transistor may be a silicon transistor or a silicon germanium bipolar transistor (SiGe transistor). The GaN transistor includes three terminals, namely, a gate, a drain, and a source. The SiGe transistor also includes three terminals, namely, a base, a collector and an emitter. The source terminal of the GaN transistor is connected directly to the collector terminal of the SiGe transistor. In addition, the gate terminal of the GaN transistor is connected directly to the emitter terminal of the SiGe transistor.

The present invention is thus configured to provide a voltage, $V_{CE}$, between the collector and emitter terminals of the SiGe transistor for biasing the GaN transistor between the latter's gate and source terminals. In addition, the GaN transistor provides a mechanism for the composite device, namely the GaNsistor, to increase its power level, and simultaneously provide built in self protection from breakdown voltage of the SiGe transistor. As will be explained, the GaNsistor of the present invention may support higher voltages which are needed for efficient radio frequency (RF) power amplifier applications.

Figure 1:
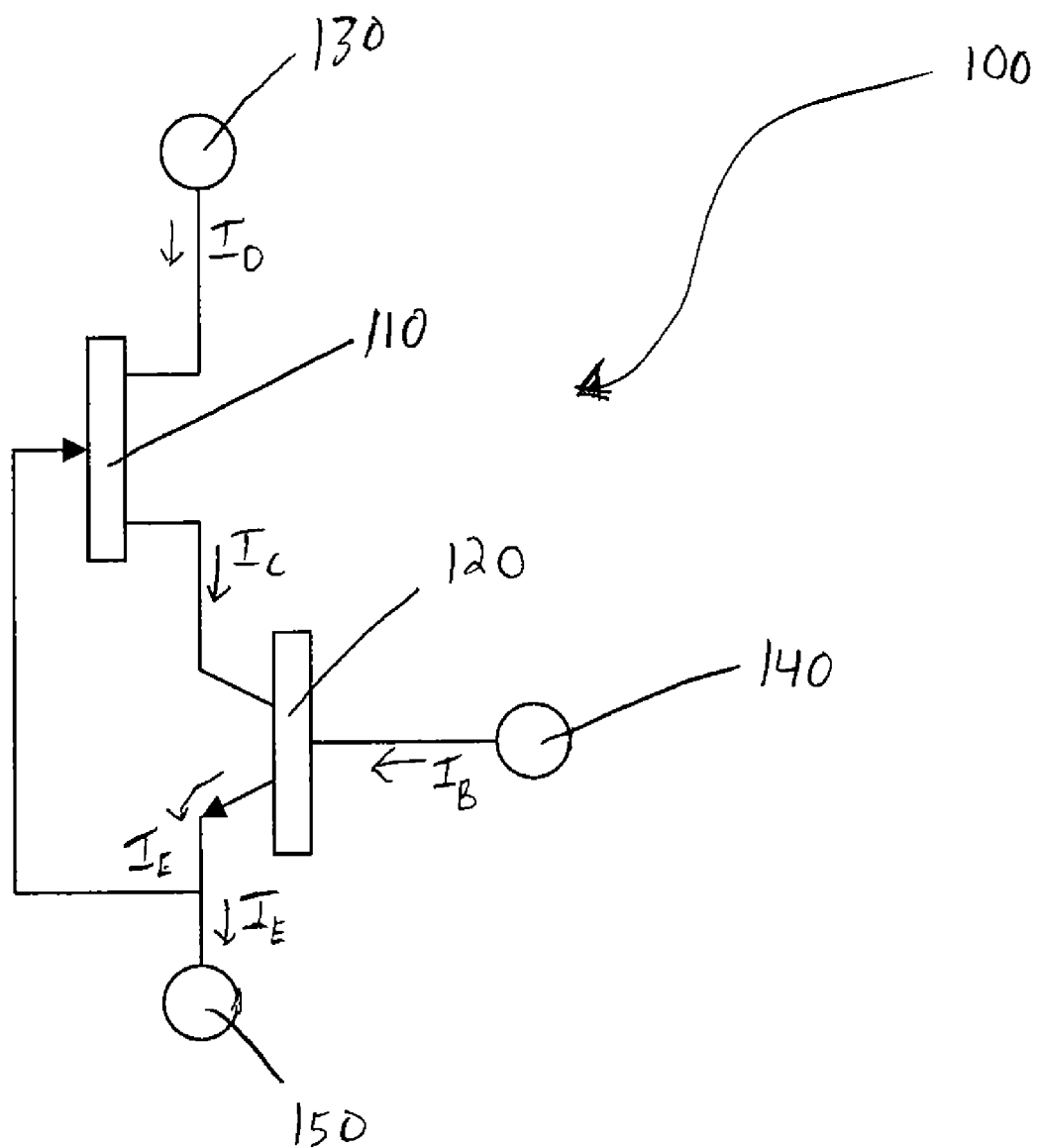
FIG. 1 is a schematic view of a composite device including a gallium nitride high electron mobility transistor (GaN transistor) and a silicon bipolar transistor or silicon germanium bipolar transistor (SiGe transistor) in accordance with an embodiment of the present invention.

A first exemplary embodiment of the present invention is illustrated in FIG. 1. This diagram illustrates the GaNsistor forming a cascade, or a composite device, generally designated as 100. The GaNsistor includes a gallium nitride transistor 110 and a silicon germanium bipolar transistor 120. The GaNsistor has three output terminals, namely the drain terminal 130, the base terminal 140 and the emitter/gate terminal 150. The gate of GaN transistor 110 is connected directly to the emitter of SiGe transistor 120, and the collector of SiGe transistor 120 is connected directly to the source of GaN transistor 110. This configuration may be referred to as a common cascode type arrangement and maintains many benefits, such as very high reverse isolation, high gain and good linearity.

It will be appreciated that the negative gate to source voltage, $V_{GS}$, of the GaN transistor becomes the positive collector to emitter voltage, $V_{CE}$, of the SiGe transistor. Under normal voltage and current bias conditions, the depletion mode GaN transistor requires a negative gate to source voltage, $V_{GS}$, to support a drain current, $I_D$, less than $I_{DSS}$ (defined as the maximum drain current with zero gate to source voltage). Since the collector current, $I_C$, of the SiGe transistor sets the source current, $I_S$, of the GaN transistor, the composite GaNsistor provides a drain current, $I_D$, at a gain of approximately 1 at the drain terminal. This is because the GaN transistor has a common gate current gain of approximately 1.

The GaN transistor 110 may operate with high voltages, for example 100 volts, whereas the nominal collector to emitter voltage, $V_{CE}$, of the SiGe transistor is between 1 and 2 volts. The SiGe transistor has a breakdown voltage under 5 volts. Consequently, a nominal voltage of 1 to 2 volts between the source and gate of the GaN transistor provides an ideal collector to emitter voltage, $V_{CE}$, for the SiGe transistor.

As described above, the drain terminal of the composite GaNsistor device supports a high voltage which provides efficient power amplification. This in effect also enhances the voltage standing wave ratio (VSWR) tolerance of the GaNsistor device. In conventional current cascode devices, if the VSWR reaches a sufficiently high level, the VSWR may actually destroy the device. The VSWR may create a sufficiently high voltage to cause self destruction of an active device. In the present invention, however, because the GaN transistor is hardy and self biasing, the GaNsistor device has high voltage breakdown protection and is tolerant of high VSWR conditions. Stated differently, the GaN transistor protects the SiGe transistor from voltage reflections seen at the drain of the GaN transistor.

In FIG. 1, the base current, $I_B$, may be calculated by dividing the collector current, $I_C$, by beta, $\beta$, as shown below:

$$I_B = \frac{I_C}{\beta}$$

Furthermore, the emitter current, $I_E$, may be calculated as follows:

$$I_E = I_C + \frac{I_C}{\beta}$$

For large values of $\beta$, $I_E$ is approximately equal to $I_C$. In addition, $I_D$ is approximately equal to $I_C$.

Figure 2:
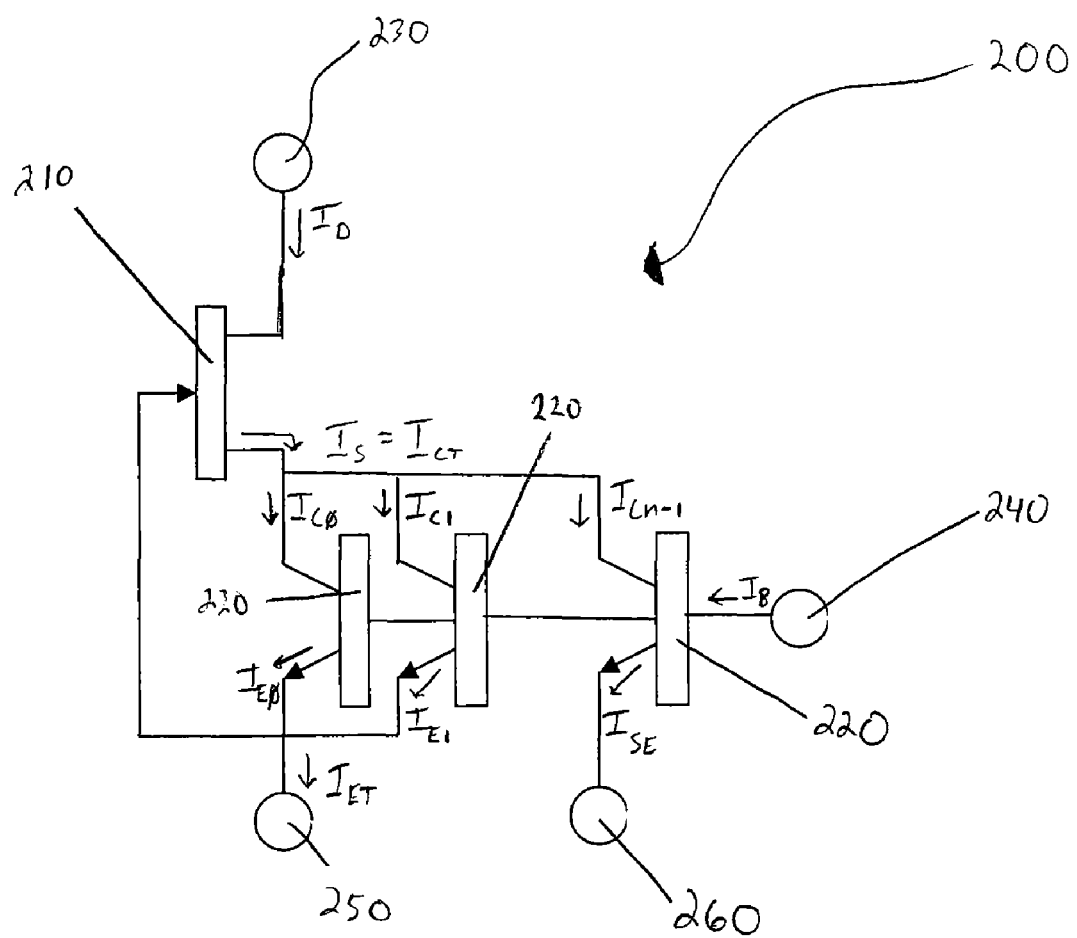
FIG. 2 is a schematic view of another composite device including a GaN transistor coupled to an array of n SiGe transistors, in accordance with an embodiment of the present invention.

A second exemplary embodiment is illustrated in FIG. 2. As shown, the single SiGe transistor of FIG. 1 is expanded into an array of n transistors 220. It will be understood that the bipolar transistors may each be of equal size or of different size. The array of n bipolar transistors 220 may include any number of transistors, such as 5 to 20, and even up to 30, for example.

The SiGe transistors 220 are connected in parallel, as shown in FIG. 2. As shown, all the collector terminals of the SiGe transistors are tied together to the source terminal of the GaN transistor, and all the base terminals of the SiGe transistors are tied together at terminal 240. In addition, all but one of the emitter terminals are tied together at terminal 250, which is also connected to the gate of the GaN transistor. This one emitter terminal of the SiGe transistor is shown connected to terminal 260 (also referred to herein as a sense emitter terminal 260) to supply an emitter current, $I_{SE}$.

Assuming that each of the SiGe transistors 200 are matched to each other and equal size, the emitter sense current, $I_{SE}$, at sense emitter terminal 260 is the same as any other of the individual emitter currents, $I_{E0}, I_{E1}, \ldots I_{En-1}$ if the sense terminal 260 is the same potential as terminal 250. Furthermore, if the n bipolar transistors in the array have equal collector voltages, equal base voltages and equal emitter voltages (and are at the same temperature), then the n SiGe transistors in the array conduct the same collector currents, the same base currents and the same emitter currents. In today's capability in device matching, semiconductor processes guarantee uniformity among transistors to a high degree of precision.

In the exemplary embodiment of FIG. 2, in which the SiGe transistors in the array are matched to each other and operate at frequencies where capacitive effects are relatively small, the source current, $I_S$, of GaN transistor 210 is approximately equal to the drain current, $I_D$, as previously explained. With high gain SiGe transistors, the total emitter current, $I_{ET}$, is approximately equal to the total collector current, $I_{CT}$, which is also the sum of each individual collector current, namely $I_{C0}, I_{C1}, \ldots I_{Cn-1}$.

The sense emitter current, $I_{SE}$, at terminal 260, in a matched array of n SiGe transistors, is the total emitter current divided by n, i.e.

$$I_{SE} = \frac{I_{ET}}{n}$$

Furthermore, $I_{CT}$ equals the source current, $I_S$, of the GaN transistor. As described above, the GaN transistor is operating in a common gate configuration. As such, terminal 250 may be grounded (not shown). Because of this configuration, $I_D$ and $I_S$ are approximately equal to each other. Therefore, the sense emitter current, $I_{SE}$, is also approximately equal to $I_D/n$, where $I_D$ is the GaN transistor drain current and n is the array size.

In the embodiment depicted in FIG. 2, n may be a large number and beta may be a large number. As such, the sense emitter current, $I_{SE}$, is approximately equal to the source current, $I_S$, of the GaN device divided by n. The source current, $I_S$, of the GaN transistor is approximately equal to the drain current, $I_D$, of the GaN transistor. Therefore, in the example of FIG. 2, $I_{SE}$ is approximately equal to $I_D/n$. It will now be appreciated that the sense emitter at terminal 260 may be used to sense and measure the current of the GaN device flowing at terminal 230.

One of the advantages of sense emitter terminal 260 is that current flowing in GaN transistor 210 is not lost. It is merely a replica of current flowing in each of the other SiGe transistors. Thus, sense emitter terminal 260 provides a non-invasive method for sensing the current throughout the entire GaN/SiGe composite device.

Figure 3:
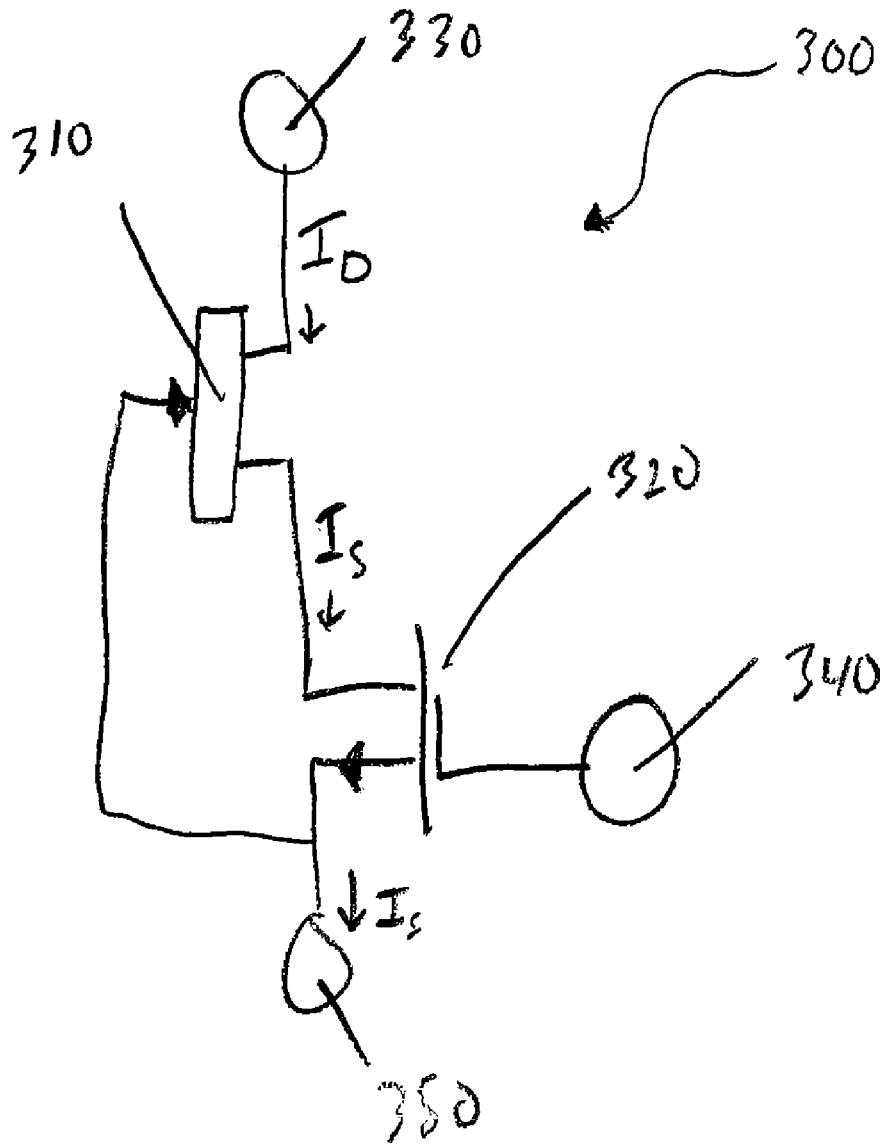
FIG. 3 is a schematic view of yet another composite device including a GaN transistor and an n-channel metal-oxide-semiconductor (NMOS) field-effect-transistor (FET).

In another embodiment, the SiGe transistor may be replaced with an n-channel metal-oxide-semiconductor field-effect-transistor (NMOS) transistor 320, as illustrated in FIG. 3. In this embodiment, the previously described collector, emitter and base of bipolar transistor 120 (FIG. 1) are replaced by drain, source and gate, respectively, of the NMOS transistor. The source is shown connected to source terminal 350, and the gate is shown connected to gate terminal 340.

In yet another embodiment, the SiGe bipolar array in FIG. 2 may be replaced with an NMOS transistor array with the similar advantages of the sense terminal 260.

In summary, the present invention provides a GaN transistor combined with a SiGe bipolar transistor to form a composite GaNsistor device having three output terminals. This device may be used for RF power amplification. This device may handle a large supply voltage and provide large gain and good linearity in a wide range of RF applications. The device may be used with transistors operating with small signal voltages which require isolation from large voltage reflections that may lead to breakdown of the transistors.

Furthermore, the GaN transistor of the present invention may be coupled with an array of n SiGe bipolar transistors or an array of NMOS transistors. In this configuration, the present invention may used for remote non-invasive sensing of a GaN transistor that supplies a large drain current, $I_D$, when driving a power transformer, for example.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A composite device comprising
   a depletion mode FET including gate, drain and source terminals, and
   an array of n bipolar transistors including
      (n–1) bipolar transistors connected in parallel having respective first collector terminals tied together, and respective first emitter terminals tied together, and
      one (1) sense bipolar transistor connected in parallel with the (n–1) bipolar transistors having a second collector terminal tied to the respective first collector terminals, and a second emitter terminal electrically isolated from the first emitter terminals,
   wherein a voltage $V_{CE}$ between the first and second collector terminals and the first and second emitter terminals is configured to bias the depletion mode FET, and
   a current $I_{SENSE}$ flowing through the second emitter terminal provides a value that is approximately equal to a current $I_D$ flowing through the drain terminal divided by (C*n), where C is a constant value and n is the size of the array.

2. The composite device of claim 1 wherein the base terminals of the array of n bipolar transistors are connected together.

3. The composite device of claim 1 wherein the array of n bipolar transistors includes n physically identical transistors.

4. The composite device of claim 1 wherein each of the n bipolar transistors is matched in size to another of the n bipolar transistors by a predetermined proportionality factor.

5. The composite device of claim 1 wherein the current $I_D$ flowing through the drain terminal is substantially equal to a sum of currents flowing through each of the first and second emitter terminals.

6. The composite device of claim 1 wherein n is an integer value between 5 and 20.

7. The composite device of claim 1 wherein the array of n bipolar transistors are replaced by an array of n NMOS transistors.

8. The composite device of claim 1 wherein
the gate terminal and the first emitter terminals are connected to ground to provide a high reverse isolation between the drain terminal and the array of n bipolar transistors.

9. A cascode device comprising:
a gallium nitride (GaN) transistor;
a silicon germanium (SiGe) bipolar transistor having collector and emitter terminals, respectively, connected to source and gate terminals of the GaN transistor;
a drain terminal of the GaN transistor for coupling to a load, in which the load is configured for connection to a relatively high voltage supply; and
a base terminal of the SiGe bipolar transistor for coupling to data, in which the data is configured to vary between voltages less than 2 volts;
wherein the SiGe bipolar transistor is a first transistor, and the device further includes:
    a plurality of SiGe bipolar transistors connected in parallel with the first SiGe bipolar transistor;
    wherein each emitter terminal of the plurality of SiGe bipolar transistors is connected to the emitter terminal of the first SiGe bipolar transistor, and
    each base terminal of the plurality of SiGe bipolar transistors is connected to the base terminal of the first SiGe bipolar transistor.

10. The cascode device of claim 9 wherein
the GaN transistor is a depletion mode field-effect-transistor, and
the gate terminal of the GaN transistor connected to a ground reference.

11. The cascode device of claim 9 wherein
the SiGe bipolar transistor is replaced by an n-channel metal-oxide-semiconductor (NMOS) field-effect-transistor (FET); and
the collector and emitter terminals of the SiGe transistor, respectively, are replaced by drain and source terminals of the NMOS FET.

12. The cascode device of claim 9 including
a second SiGe bipolar transistor connected in parallel with the first SiGe bipolar transistor;
a base terminal of the second SiGe bipolar transistor connected to the base terminal of the first SiGe bipolar transistor, and
an emitter terminal of the second SiGe bipolar transistor connected to an output terminal for sensing current flowing in the GaN transistor.

13. The cascade device of claim 9 wherein
The SiGe bipolar transistor is replaced by a silicon bipolar transistor.

* * * * *